(12) United States Patent
Lam

(10) Patent No.: US 8,429,814 B2
(45) Date of Patent: Apr. 30, 2013

(54) METHOD OF ASSEMBLING A MULTI-COMPONENT ELECTRONIC PACKAGE

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 123 days.

(21) Appl. No.: 12/885,212

(22) Filed: Sep. 17, 2010

(65) Prior Publication Data

US 2011/0001215 A1 Jan. 6, 2011

Related U.S. Application Data

(63) Continuation of application No. 11/557,864, filed on Nov. 8, 2006, now abandoned.

(51) Int. Cl.
*H05K 3/30* (2006.01)
(52) U.S. Cl.
USPC ............ 29/834; 29/832; 29/852; 174/262; 438/113; 438/459
(58) Field of Classification Search ........... 29/412, 29/830–834, 840, 841, 846, 848, 852; 174/255, 174/262; 257/687, 723; 438/108, 113, 459
See application file for complete search history.

(56) References Cited

U.S. PATENT DOCUMENTS

| | | | |
|---|---|---|---|
| 4,866,507 A | 9/1989 | Jacobs et al. | |
| 4,918,811 A | 4/1990 | Eichelberger et al. | |
| 5,018,002 A | 5/1991 | Neugebauer et al. | |
| 5,216,806 A | 6/1993 | Lam | |
| 5,373,627 A | 12/1994 | Grebe | |
| 5,608,262 A | 3/1997 | Degani et al. | |
| 6,038,133 A | 3/2000 | Nakatani et al. | |
| 6,239,496 B1 | 5/2001 | Asada | |
| 6,356,453 B1 | 3/2002 | Juskey et al. | |
| 6,510,606 B2 | 1/2003 | Barnett et al. | |
| 6,528,351 B1 | 3/2003 | Nathan et al. | |
| 6,538,210 B2 | 3/2003 | Sugaya et al. | |
| 6,650,011 B2 | 11/2003 | Partosa et al. | |
| 6,673,698 B1 * | 1/2004 | Lin et al. ............... 438/459 |

(Continued)

FOREIGN PATENT DOCUMENTS

| | | |
|---|---|---|
| WO | WO-2008/057895 A1 | 5/2008 |
| WO | WO-2008/057896 A2 | 5/2008 |

OTHER PUBLICATIONS

"U.S. Appl. No. 11/557,864, Non-Final Office Action mailed on Jan. 23, 2009", 8 pgs.

(Continued)

*Primary Examiner* — Donghai D. Nguyen
(74) *Attorney, Agent, or Firm* — Fish & Richardson P.C.

(57) ABSTRACT

An electronic multi-component package is assembled by placing multiple electronic components within multiple openings of a package substrate, then depositing and curing adhesive filler in gaps between the components and the inner peripheries of the openings. Circuit features, including conductive interconnects, are formed by thin-film photolithography over both front and back surfaces of the package substrate. Preformed conductive vias through the package substrate provide electrical connection between circuit features on opposite substrate surfaces. Additional electronic components may be attached to conductive lands on at least one side of the package. The circuit features also include contact pads for external package connections, such as in a ball-grid-array or equivalent structure.

11 Claims, 3 Drawing Sheets

U.S. PATENT DOCUMENTS

| | | | |
|---|---|---|---|
| 6,688,300 | B2 | 2/2004 | Tieber |
| 6,790,710 | B2 | 9/2004 | McLellan et al. |
| 6,791,192 | B2 | 9/2004 | Lin et al. |
| 6,961,245 | B2 | 11/2005 | Ikuta et al. |
| 6,974,724 | B2 | 12/2005 | Hyvönen et al. |
| 6,991,966 | B2 * | 1/2006 | Tuominen ............... 438/119 |
| 7,045,901 | B2 | 5/2006 | Lin et al. |
| 7,087,992 | B2 | 8/2006 | Chua et al. |
| 7,242,092 | B2 | 7/2007 | Hsu |
| 7,285,855 | B2 | 10/2007 | Foong |
| 7,449,363 | B2 | 11/2008 | Hsu |
| 2005/0116337 | A1 | 6/2005 | Chua et al. |
| 2006/0180342 | A1 | 8/2006 | Takaya et al. |
| 2006/0272853 | A1 | 12/2006 | Muramatsu et al. |
| 2008/0101044 | A1 | 5/2008 | Chang |
| 2008/0123318 | A1 | 5/2008 | Lam |

OTHER PUBLICATIONS

"U.S. Appl. No. 11/557,864, Final Office Action mailed Jul. 30, 2009", 13 pgs.

"U.S. Appl. No. 11/557,864, Non-Final Office Action mailed May 18, 2010", 16 pgs.

"U.S. Appl. No. 11/557,864, Response filed Feb. 1, 2010 to Final Office Action mailed Jul. 30, 2009", 11 pgs.

"U.S. Appl. No. 11/557,864, Response filed Nov. 26, 2008 to Restriction Requirement mailed Oct. 27, 2008", 9 pgs.

"U.S. Appl. No. 11/557,864, Response filed May 22, 2009 to Non-Final Office Action mailed Jan. 23, 2009", 11 pgs.

"U.S. Appl. No. 11/557,864, Restriction Requirement mailed Oct. 27, 2008", 5 pgs.

"International Application No. PCT/US07/83246, International Search Report mailed Apr. 17, 2008", 2 pgs.

"International Application No. PCT/US07/83246, Written Opinion mailed Apr. 17, 2008", 7 pgs.

"International Application No. PCT/US2007/083251, International Preliminary Examination Report mailed Nov. 14, 2008", 8 pgs.

"International Application No. PCT/US2007/083251, International Search Report mailed May 7, 2008", 2 pgs.

"International Application No. PCT/US2007/083251, Written Opinion mailed May 7, 2008", 7 pgs.

* cited by examiner

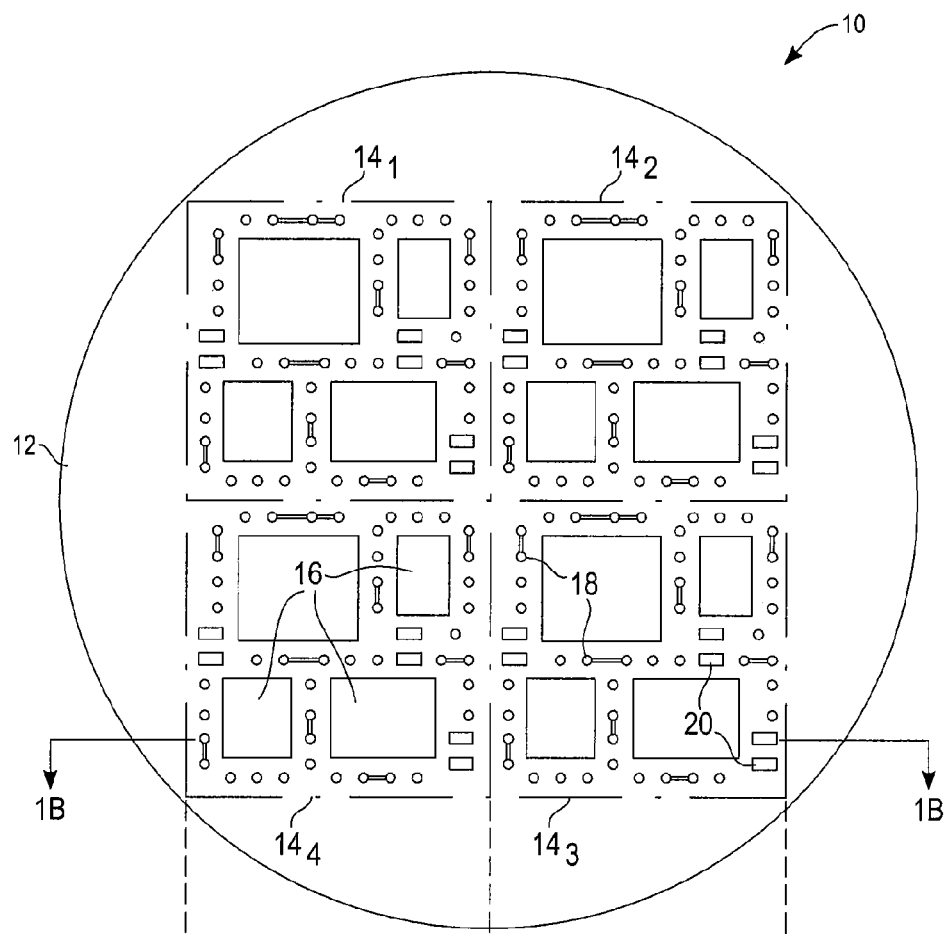
*Fig._1A*
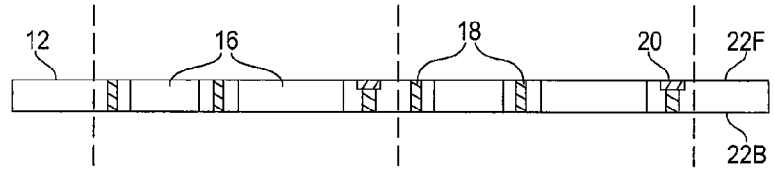
*Fig._1B*

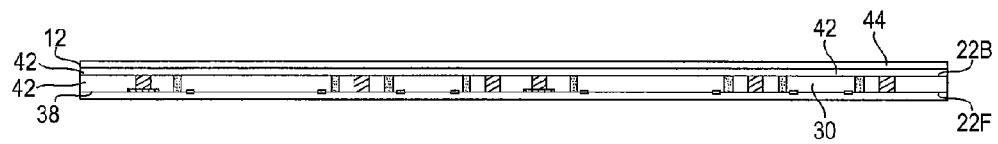
Fig._ 2E
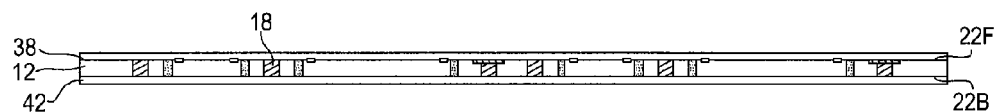
Fig._ 2F
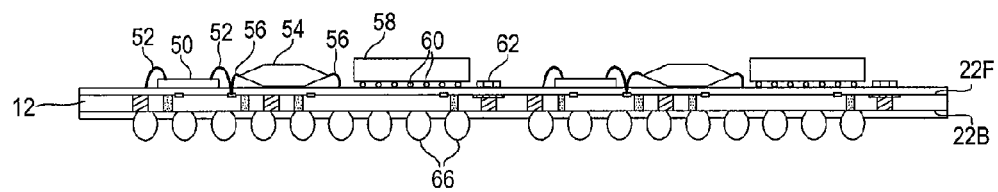
Fig._ 2G
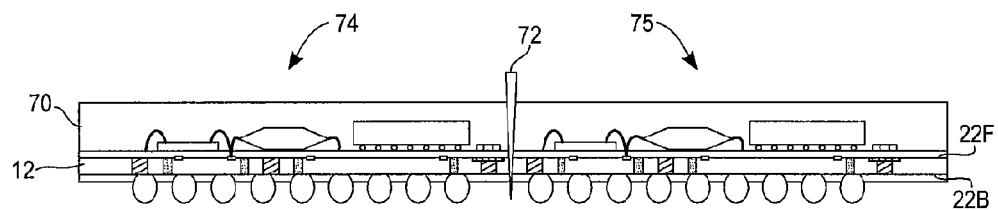
Fig._ 2H

METHOD OF ASSEMBLING A MULTI-COMPONENT ELECTRONIC PACKAGE

CLAIM OF PRIORITY

This application is a continuation of and claims the benefit of priority under 35 U.S.C. §120 to U.S. patent application Ser. No. 11/557,864, entitled "MULTI-COMPONENT ELECTRONIC PACKAGE," filed on Nov. 8, 2006, now abandoned, which is hereby incorporated by reference herein in its entirety.

TECHNICAL FIELD

The present invention relates to integrated circuit (IC) chip packages and the mounting of one or more IC dice to a support substrate and/or frame together with associated circuit components and interconnects.

BACKGROUND ART

Multi-component electronic packages and system-in-package (SIP) packages that are employed in the electronics industry today all utilize substrates for device inter-connection and attachment. Typical organic substrate materials are epoxy-glass, polyimide, and fluoropolymer laminates. Typical inorganic substrate materials are ceramics, low-temperature co-fire ceramics (LTCC) and silicon. The interconnect circuitry and component attach features are fabricated onto the substrates prior to components assembly.

With the exception of a silicon substrate, which employs thin-film metal deposition processes for the circuitry fabrication to yield line geometries on the order of one micrometer, all of the other substrate materials yield line geometries that are 50 micrometers or larger. A silicon substrate can only be used in single-sided applications and is often fragile in the final package form. The larger line geometries of the other substrates necessitate a larger final package size. The resultant longer interconnect lengths can also compromise package performance. Package designs with smaller package footprints and lower profiles, along with higher performance and yields, are ever being sought in the electronics industry.

SUMMARY DISCLOSURE

The present invention is method of assembling a multi-component electronic package and the package so formed in which microelectronic integrated circuit (IC) dice and/or discrete active/passive components are embedded into a "windowed" substrate carrier, planarized on both top and bottom surfaces. Electrically conductive interconnects and dielectric layers are deposited, or otherwise formed, on the top and bottom surfaces to electrically connect the embedded components.

In particular, a package substrate is provided, having defined front and back surfaces, with conductive vias through the package substrate. Multiple openings in the package substrate are sized to receive electronic components. After securing the package substrate on a vacuum support, multiple electronic components are placed within those openings and secured in place by the vacuum support. Adhesive filler material is deposited within a gap between the components and the inner peripheries of the corresponding openings, and then the filler is cured so as to permanently secure the embedded electronic components within the package substrate.

Circuit features are then formed in one or more layers over both front and back surfaces of the package substrate, for example, by thin-film photolithography. Features on opposite surfaces are electrically connected to each other by means of the conductive vias through package substrate. The circuit features include conductive interconnects that are electrically connected to the multiple electronic components embedded within the substrate. Integrated passive features, such as inductors, can also be formed during the circuitry fabrication process. Additional electronic components can be attached to resulting structure, e.g., at metal lands. A land-grid array, ball-grid array or pin-grid array can be formed on a back surface of the package substrate.

Package components are thus assembled onto the substrate to form an extremely compact, highly integrated, multi-component package or system-in-package (SIP) that provides an extremely small footprint and low profile. The electrical performance of the package is improved due to the ability to place the IC dice and other components in close proximity. The thin-film conductive interconnects formed on the planarized surfaces allow a much finer line width and spacing geometry in comparison with even the most advanced printed circuit board technologies. It also allows precise, high Q, integrated passive inductors to be formed in close proximity to the IC dice. With the interconnect layers deposited directly above and below the IC dice, a more efficient use is made of the package's footprint area, resulting in a smaller package size. The standard die-attach, wire bond or flip-chip attach processes can be eliminated by using this embedded components method.

BRIEF DESCRIPTION OF THE DRAWINGS

FIGS. 1A and 1B are respective top plan and side sectional views (the latter taken through the line 1B-1B in FIG. 1A) of a wafer substrate serving as a starting point for assembly of a multi-component electronic package in accord with the present invention.

FIGS. 2A through 2H are respective side sectional views, analogous to FIG. 1B, at various stages in a process of assembling an electronic package in accord with the present invention.

DETAILED DESCRIPTION

Figure 2A:
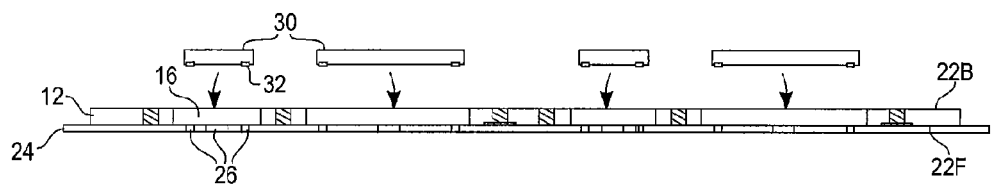

With reference to FIGS. 1A and 1B, a wafer 10 forms a substrate 12 for one or more IC chip packages. When cut into sections, e.g., $14_1$, $14_2$, $14_3$, $14_4$, each of those sections of the wafer 10 will define a separate package. The substrate 12 is typically composed of a dielectric material, such ceramics, glass, or plastics (e.g., epoxy, polyimide, or fluoropolymers). The substrate 12 has open cavities 16 into which IC die and other discrete electronic components will be placed. The width and length dimensions of the open cavities 16 are normally slightly larger than the components that will be inserted to allow tolerance for variations in the individual component size and room for adding an adhesive compound between the components and the inner periphery of the cavities 16.

Conductive vias 18 through the substrate 12 provide electrical pathways between the designated front and back surfaces 22F and 22B of the substrate 12 upon which electrical interconnects and other circuit elements (inductors, etc.) will be formed. Component lands 20, also conductive, may serve as attachment pads for discrete components, and also as land-grid, ball-grid or pin-grid pads for electrically connecting the resultant IC package to a printed circuit board or other system-level circuit structure.

With reference to FIG. 2A, a method of assembling the package begins with the aforementioned substrate 12 being mounted front-side down onto a die alignment vacuum plate 24. Various IC dice and discrete electrical components (active or passive) to be embedded in the substrate 12 are placed within the cavities 16. Preferably, IC dice will be place active side 32 down, so that the active side 32 will be generally coplanar with the front surface 22F of the substrate. In this way, we don't need to use a substrate having the same thickness as the IC dice, and the various IC dice being embedded need not all have the same thickness. Vacuum openings 26 in the vacuum plate 24 will hold the substrate 12, and the IC dice and other discrete components 30 in a fixed position.

Figure 2B:
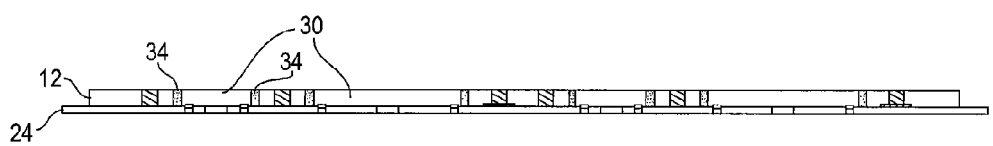
Figure 2C:
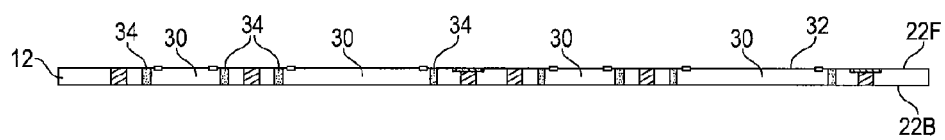

With reference to FIG. 2B, normally the components 30 will be somewhat smaller in length and width dimensions than the cavities 16 in which they are place. The gaps between the components 30 and the inner peripheries of the cavities 16 are filled with an adhesive compound 34. After curing of the adhesive compound 34, the substrate 12 with its embedded components 30 is released by the vacuum plate 24. The cured adhesive compound 34 now holds the embedded components 30 in place. Depending on the adhesive compound being used to fill the gaps, the curing can be performed by application of heat (e.g., in a furnace) or by ultraviolet light. A self-curing adhesive (e.g., an epoxy resin with catalyst) could be also be used.

The designated back side of the package (opposite from that containing the active surfaces on the die) may be kept relatively planar by controlling the thicknesses of the die and discrete components, or may be made planar, if needed, by performing a post-embedding grind process, with a liquid dielectric coating added to facilitate the planarizing.

Figure 2D:
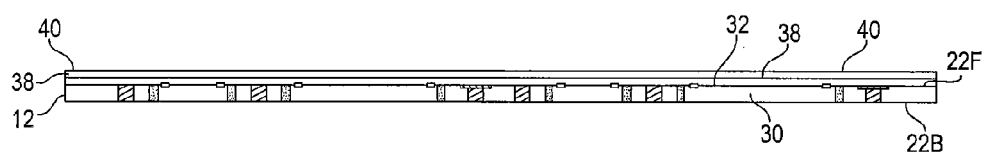

With reference to FIGS. 2D through 2F, thin-film deposition and photolithographic etching processes are used to build-up one or more layers circuit features over both surfaces 22B and 22F of the substrate assembly 12. On each side, there can be either a single layer of interconnects and other integrated circuit features, or, more usually, multiple layers of interconnects and features separated by dielectric material layers and connected where needed by vias.

For example, as seen in FIG. 2D, a thin-film metallic layer 38 may be deposited over the front surface 22F of the substrate assembly 12, followed by a photolithographic mask layer 40. After patterning and etching of the thin-film metallic layer 38, removal of the mask layer 40, and possible repeating of the deposition and patterning of additional layers, such as a dielectric layer, integrated circuit features result. These circuit features may include metal lands for and interconnects between the embedded IC dice and other embedded components 30, as well as integrated passive elements, such as thin-film inductors.

Likewise, further integrated circuit features are also formed on the back surface 22B, including metallic lands, by means of successive deposition, patterning and etching using one or more thin-film and mask layers 42 and 44, as seen in FIG. 2E.

The result is a substrate assembly 12 with patterned circuitry 38 and 42 on both front and back sides, 22F and 22B, of the substrate. As already noted with reference to FIGS. 1A and 1B, the circuitry on opposite sides of the substrate assembly 12 in FIG. 2F are connected to each other by means of the vias 18 that were pre-formed in the starting substrate.

With reference to FIG. 2G, additional electronic components can be attached to the resulting structure at metal lands on one of the surfaces, for example, above the front surface 22F. This may include die 50 attached with wire bonds 52, leaded packages 54 attached with their leads 56, ball-grid-array (BGA) packages 58 attached with solder balls 60, and discrete components 62. The opposite side of the assembly 12, for example, back side 22F, may have contact pads formed thereon, such as a BGA structure of solder balls 66. Alternatively, pins could be attached at metal lands on the back surface to form a pin-grid-array (PGA) package structure. Or, the lands themselves, formed on the back surface's thin film layer 42 in FIGS. 2E and 2F, could define a land-grid-array.

With reference to FIG. 2H, the electronic components 50, 54, 58, etc. above the front surface 22F may optionally be covered by an epoxy over-mold 70, coating or lid cover to protect them from damage during handling of the assembled package. Finally, the wafer 10 seen in FIG. 1A, now a completed package assembly, undergoes saw singulation into individual packages 74, 75, etc., with the cuts made along the dashed lines indicated in FIG. 1A that demarcate the various segments.

The invention claimed is:

1. A method of assembling an multi-component electronic package, comprising:
   providing a package substrate having defined front and back surfaces, with conductive vias through the package substrate providing electrical connections between the front and back surfaces, and with multiple openings in the package substrate to receive electronic components;
   securing the front surface of the package substrate on a vacuum support;
   placing, through the back surface of the package substrate, multiple electronic components having front and back sides within the multiple openings of the package substrate, the electronic components being secured in place by the vacuum support, each electronic component being spaced from an inner periphery of the electronic component's corresponding opening of the package substrate by a gap;
   aligning the front sides of the multiple electronic components with the front surface of the package;
   depositing an adhesive filler material within the gap and then curing the adhesive filler material, such that the electronic components within the openings are permanently secured to the package substrate; then adding a liquid dielectric coating to the back side of at least a first electronic component of the multiple electronic components, wherein the first electronic component is thicker than the package substrate; grinding the back side of at least the first electronic component to align the back side with the back surface; and
   forming circuit features in one or more dielectric layer on both front and back surfaces of the package substrate, circuit features on opposite surfaces of the package substrate being electrically connected to each other by means of the conductive vias through the package substrate, the circuit features including one or more thin-film inductors and conduct interconnects that are electrically connected to the multiple electronic components and the one or more thin-film inductors, the circuit features on at least one surface of the package substrate including a set of contact pads defining external connection locations for the assembled multi-component electronic package.

2. The method as in claim 1, wherein the package substrate comprises a dielectric material with metallic vias therethrough.

3. The method as in claim 1, wherein at least one of the multiple electronic components placed within the openings of the package substrate is an integrated circuit (IC) die.

4. The method as in claim 3, wherein the IC die has an active surface, and the IC die is placed in an opening of the package substrate to align its active surface with the front surface of the package substrate.

5. The method as in claim 1, wherein the circuit features are formed by photolithography, with deposition a thin-film feature layer and a mask layer over the feature layer, patterning and etching of the feature layer using the mask layer, removal of the mask layer, and repeating to pattern additional feature layers.

6. The method as in claim 1, wherein the circuit features include integrated passive circuit elements.

7. The method as in claim 1, wherein the circuit features are successively formed first on one surface of the package substrate and then on the other surface of the package substrate.

8. The method as in claim 1, wherein the circuit features formed on the package substrate include conductive lands and the method further comprises attaching additional electronic components onto the designated front surface of the package substrate with electrical connections to the conductive lands.

9. The method as in claim 8, further comprising providing a protective covering over the additional electronic components.

10. The method as in claim 1, wherein the set of contact pads form a package contact structure selected from the group consisting of a land-grid-array, ball-grid-array and pin-grid-array.

11. The method as in claim 1, wherein the package substrate is a wafer for assembling multiple packages, and the method, after forming the circuit features, further includes segmenting the wafer into individual assembled packages.

* * * * *